(12) United States Patent
Carter et al.

(10) Patent No.: US 6,475,564 B1
(45) Date of Patent: Nov. 5, 2002

(54) DEPOSITION OF A SILOXANE CONTAINING POLYMER

(75) Inventors: Steven Carter, Gwent; Christine Janet Shearer, Bristol, both of (GB)

(73) Assignee: Trikon Equipment Limited, Newport (GB)

( * ) Notice: Subject to any disclaimer, the term of this patent is extended or adjusted under 35 U.S.C. 154(b) by 0 days.

(21) Appl. No.: 09/582,859

(22) PCT Filed: Jan. 20, 1999

(86) PCT No.: PCT/GB99/00191

§ 371 (c)(1),
(2), (4) Date: Jul. 6, 2000

(87) PCT Pub. No.: WO99/38202

PCT Pub. Date: Jul. 29, 1999

(30) Foreign Application Priority Data

Jan. 23, 1998 (GB) .............................................. 9801359

(51) Int. Cl.[7] .......................................... H01L 21/312
(52) U.S. Cl. ........................... 427/249.15; 427/255.29; 427/255.6; 438/780; 438/787
(58) Field of Search .................... 427/574, 578, 427/579, 255.29, 255.37, 249.15, 255.6; 438/780, 787

(56) References Cited

U.S. PATENT DOCUMENTS 4,992,306 A * 2/1991 Hochberg et al. ...... 427/255.29
5,314,724 A * 5/1994 Tsukune et al. ............. 427/489
5,637,351 A * 6/1997 O'Neal et al. ........... 427/255.3
5,962,581 A * 10/1999 Hayase et al. .............. 427/387
6,072,227 A * 6/2000 Yau et al. .................... 257/642

FOREIGN PATENT DOCUMENTS

| EP | 0 440 154 A1 | 8/1991 |
| EP | 08213378 | * 8/1996 |
| EP | 0 742 290 A1 | 11/1996 |
| JP | 08213378 | 8/1996 |
| JP | 10209148 | 8/1998 |
| WO | WO 94/01885 | 1/1994 |

OTHER PUBLICATIONS

C.D. Dobson et al., "Advanced SiO2 Planarization Using Silane and H2O2", Dec. 1994, Semiconductor International, p. 85–87.

* cited by examiner

Primary Examiner—Bret Chen
(74) Attorney, Agent, or Firm—Volentine Francos, PLLC

(57) ABSTRACT

An insulating layer is formed onto a surface of a semiconductor substrate by reacting a silicon-containing compound and a compound containing peroxide bonding to deposit a short-chain polymer on the surface of the semiconductor substrate. A deposition rate of the short-chain polymer is increased by farther reacting a substance which associates readily with the compound containing the peroxide bonding.

46 Claims, 1 Drawing Sheet

DEPOSITION OF A SILOXANE CONTAINING POLYMER

Figure 1:
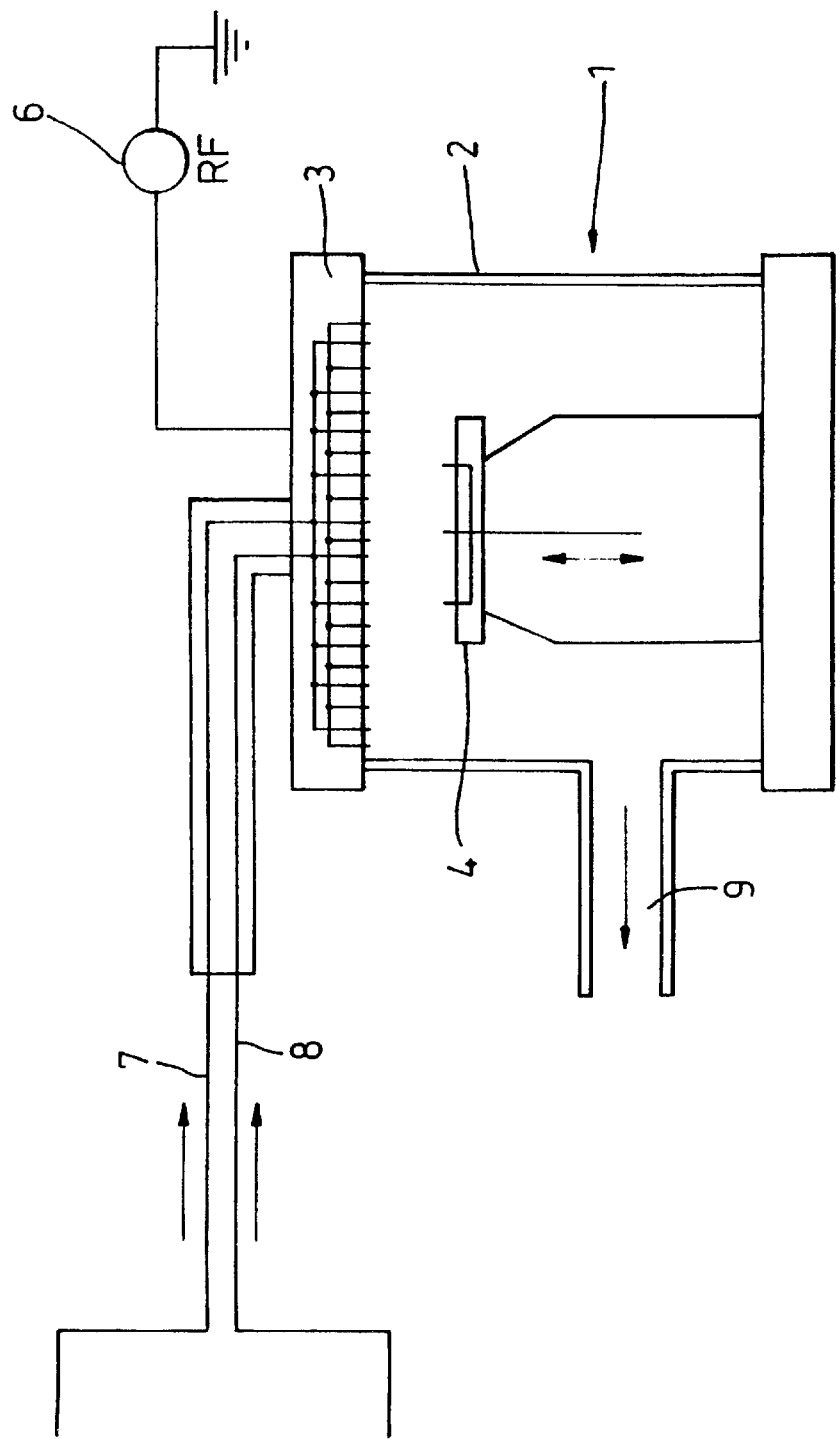

This invention relates to a method and apparatus for treating a substrate, such as a semiconductor wafer and, in particular, but not exclusively, to a method and apparatus for providing an increase in deposition rate of a high grade insulation layer. In addition, a low dielectric constant (known as low k) may also be provided by the method and apparatus of the present invention.

In the earlier patent application WO94/01885, the contents of which are incorporated herein by reference, a planarization technique is described in which a liquid short-chain polymer is formed on a semiconductor wafer by reacting silane ($SiH_4$) or a higher silane with hydrogen peroxide ($H_2O_2$). In addition, the earlier co-pending patent application PCT/GB97/02240 discloses a method and apparatus for providing a low dielectric constant in a planarization operation. The method disclosed utilizes an organosilane compound and a compound containing peroxide bonding to provide a short-chain polymer as a deposition layer on a semiconductor substrate. It has been found that the reactants used in prior art processes provide very low deposition rates of the resulting polymer layer on the semiconductor substrate. For example, investigations into the reaction of phenylsilane and $H_2O_2$ yielded low deposition rates of the order of 600 Å/min.

The main purpose of the present invention is to put down a high grade insulation layer as rapidly as possible, preferably without having a detrimental effect on the low dielectric constant of the insulator, and even improving the dielectric constant.

We have found that it is possible to increase significantly the deposition rates whilst maintaining other desirable properties, including a low dielectric constant, thereby improving the overall process of the deposition.

According to a first aspect of the present invention there is provided a method of treating a substrate, which method comprises positioning the substrate in a chamber, introducing into the chamber in the gaseous or vapour state a silicon-containing compound, a further compound containing peroxide bonding, and a substance which associates readily with the compound containing peroxide bonding, and reacting the silicon-containing compound with the further compound and the associating substance to provide on the substrate an insulating layer.

Whilst the applicant is not to be restricted hereby, it is thought that the associating substance promotes the initiation between the compound containing peroxide bonding and the silicon-containing compound. Thus, the further compound, and the associating substance react with each other in the formation of the insulating layer.

The substance which associates readily with the compound containing peroxide bonding is preferably an oxidising agent, for example oxygen, ozone or tetraethoxysilane (TEOS). However, any material soluble in the compound containing peroxide bonding is appropriate, for example carbon monoxide or carbon dioxide. The most preferred oxidising agent is oxygen.

The reaction which occurs is a chemical vapour deposition process and does not require and additional plasma, although such a plasma (for example a weakly ionized plasma) may, if required, be used within the process chamber. Thus, the reactants are preferably capable of reacting spontaneously. The reaction is thought to be a surface reaction.

The silicon-containing compound may be organosilane, for example on of the general formula $C_xH_y)_zSi_nH_a$, where x, y, z, n and a are any suitable values, for example integers. The silicon containing compound is preferably of the general formula R—$SiH_3$. Preferably, R is a methyl, ethyl, phenyl, or vinyl group and it is particularly preferred that R is a phenyl or methyl group. Alternatively, the silicon-containing compound may be a silane (for example silane itself) or a higher silane. A further alternative is dimethyl-silane. The silicon-containing compound is preferably not TEOS or other organometallic compound.

Any suitable combination of the components may be used but as will be understood by those skilled in the art certain combinations and pressures may not be appropriate as they are explosive in the chamber.

The compound containing peroxide bonding is preferably hydrogen peroxide.

In an alternative embodiment, the method may further comprise the step of introducing an additional gas, for example nitrogen, into the chamber.

The associating substance can be introduced in any way. Thus, the associating substance may be pre-mixed with the compound containing peroxide bonding or the silicon-containing compound prior to introduction into the chamber, although it has been observed that the deposition rate is particularly increased if the associating substance is pre-mixed with the compound containing peroxide bonding. Alternatively, the associating substance may be introduced into the chamber as a separate component.

When R is a methyl group, e.g. when methyl silane is the silicon-containing compound, the deposition rate is increased to about 1.1 µm/min. Thus when oxygen is used as the associating substance the deposition rate was increased from about 8000 Å/min which was the rate in the case in which no oxygen was used. When R is a phenyl group the deposition rate is increased from about 600 Å/min to 2700 Å/min. Furthermore, when oxygen is used as the associating substance, the deposition rate when a silane or higher silane is used is increased from about 9000 Å/min to about 1.2 µm/min. In addition, it has been found that the addition of the associating substance, in particular oxygen, leads to a slight reduction in the dielectric constant of the film formed on the substrate, typically from 3.2 to 2.8.

A particularly preferred flow rate of the silicon-containing compound into the chamber is between 20 and 145 Sccm ($3.4 \times 10^{-2}$ to 0.24 Pa.m$^3$/s), even more preferably about 45 Sccm ($7.6 \times 10^{-2}$ Pa.m$^3$/s). The flow rate of the compound containing peroxide bonding into the chamber is preferably between 0.2 and 1.0 g/min and is even more preferably about 0.22 g/min. The flow rate of the associating substance into the chamber is preferably up to 50 Sccm ($8.4 \times 10^{-2}$ Pa.m$^3$/s) and even more preferably is about 10 Sccm ($1.7 \times 10^{-2}$ Pa.m$^3$/s). Above 20 Sccm spontaneous momentary pressure bursts are observed indicating vigorous reactions and rates above 50 Sccm may well therefore be unsafe in practice. Whilst any suitable pressure in the chamber can be used, it has been found that appropriate pressures are below atmospheric pressure, for example in the range of 200 to 500 mT, preferably about 1000 mT. When a further gas is used, its flow rate into the chamber is preferably between 50 and 1000 Sccm ($8.4 \times 10^{-2}$ to 1.7 Pa.m$^3$/s), even more preferably about 80 Sccm (0.14 Pa.m$^3$/s). The units Sccm (Standard Cubic Centimetres per Minute) are at standard temperature and pressure.

The method may, if required, comprise the further step of removing water and/or OH from the layer formed from the short-chain polymer. Furthermore, the method may further comprise the step of forming or depositing an underlayer or a base layer prior to the deposition of the polymer layer. The method may further comprise the step of depositing or forming a capping layer on the surface of the formed layer and this layer is preferably applied in a PECVD process.

According to a second aspect of the present invention there is provided an apparatus for implementing the above method which comprises means for introducing the components into the chamber and platen means for supporting the substrate. The apparatus may comprise a Chemical Vapor Deposition (CVD) or Plasma Enhanced Vapor Deposition process (PECVD) chamber.

Whilst the invention has been described above, it extends to any inventive combination of the features set out above or in the following description.

The invention will now be described, by way of example, with reference to the following example and the following drawing, and in which:

FIG. 1 is a schematic view of an apparatus for performing the treatment method.

Referring to FIG. 1, an apparatus for treating semiconductor wafers, or the like, is schematically illustrated at 1. The general construction of such an apparatus is well known in the art and therefore only the features which are relevant for the understanding of the invention are described. Thus, the apparatus 1 includes a chamber 2 having a duplex shower head 3 and a wafer support 4. The shower head 3 is connected to RF source 6 to form one electrode while the support 4 is earthed and forms another electrode. Alternatively, the RF source 6 could be connected to the support 4 and the shower head 3 earthed. The shower head 3 is connected by respective pipes 7 and 8 to a source of $O_2$ and $H_2O_2$ on the one hand and phenylsilane ($C_6H_8Si$) on the other hand.

In use, the apparatus is arranged to deposit a short chain polymer on a semiconductor wafer or other substance This may also provide planarisation either locally or globally, or "gap filling". The polymer is formed by introducing the components into the chamber, together with a carrier gas, for example nitrogen, if required, and reacting them within the chamber. The reaction may occur spontaneously or may require initiation, for example from an external energy source. The nitrogen may be needed to improve the process due to the small flow rates of the other components, and it may form part of the process. The flow of the reactants is maintained at a desired level and they are removed from the chamber via outlet 9. The resultant polymer is deposited on the wafer. As regards the mechanism involving oxygen, whilst the applicant is not to be restricted hereby, it is believed that the $O_2$ is being associated with the $H_2O_2$ promoting the reaction between $H_2O_2$ and $C_6H_8Si$. The reaction may take place at the wafer surface.

EXAMPLE

Investigations into the reaction of phenylsilane ($C_6H_8Si$) and $H_2O_2$ yielded very low deposition rates (of the order of 600 Å/min). In order to promote the reaction, a small amount of additional oxidant —$O_2$— was added to the process which proved successful in increasing the deposition rate to in excess of 2700 Å/min.

The process used for the investigations was:

| | | preferred process | range investigated |
|---|---|---|---|
| $C_6H_8Si$ | (Sccm) | 45 | 20 ---> 145 |
| $H_2O_2$ | (g/min) | 0.22 | 0.2 ---> 1.0 |
| $N_2$ | (Sccm) | 80 | 50 ---> 1000 |

-continued

| | | preferred process | range investigated |
|---|---|---|---|
| $O_2$ | (Sccm) | 10 | 0 ---> 50 |
| Pressure | (mT) | 1000 | 200 ---> 5000 |

As has already been mentioned it was found that, when the rate of $O_2$ flow is increased above 20 Sccm, an increasingly vigorous reaction occurred causing large fluctuations in chamber pressure.

Furthermore, the addition of $O_2$ has been found to increase the deposition rate of a process in which the silicon containing compound as a silane or higher silane from about 9000 Å/min to about 1.2 μm/min, and of a process in which $MeSiH_3$ is used from approximately 8000 Å/min to about 1.1 μm/min.

What is claimed is:

1. A method of depositing a siloxane containing polymer on a substrate, which method comprises positioning the substrate in a chamber, introducing into the chamber in the gaseous or vapor state a silicon-containing compound, a further compound containing peroxide bonding, and a substance which associates readily with the compound containing peroxide bonding, and reacting the silicon-containing compound with the further compound and the associating substance to provide a polymer layer on the substrate.

2. A method according to claim 1, wherein the polymer layer is a short-chain polymer layer.

3. A method according to claim 1, wherein the associating substance is an oxidizing agent.

4. A method according to claim 3, wherein the polymer layer is a short-chain polymer layer.

5. A method according to claim 3, wherein the oxidizing agent is selected from the group consisting of oxygen, ozone, and tetraethoxysilane.

6. A method according to claim 5, wherein the oxidizing agent is oxygen.

7. A method according to claim 1, wherein the silicon-containing compound is an organosilane of the general formula $C_xH_y$—$Si_nH_a$ or $(C_xH_y)_2Si_nH_a$.

8. A method according to claim 7, wherein the polymer layer is a short-chain polymer layer.

9. A method according to claim 1, wherein the silicon-containing compound is of the general formula R—$SiH_3$.

10. A method according to claim 9 wherein R is a methyl, ethyl, phenyl or vinyl group.

11. A method according to claim 10, wherein R is a phenyl or methyl group.

12. A method according to claim 11, wherein R is a methyl group, and a deposition rate of the polymer layer is about 1.1 μm/min.

13. A method according to claim 12, wherein the polymer layer is a short-chain polymer layer.

14. A method according to claim 11, wherein R is a Phenyl group and a deposition rate of the polymer layer is about 2700 Å/min.

15. A method according to claim 14, wherein the polymer layer is a short-chain polymer layer.

16. A method according to claim 1, wherein the silicon-containing compound is a silane or a higher silane.

17. A method according to claim 16, wherein a deposition rate of the polymer layer is about 1.2 μm/min.

18. A method according to claim 1, wherein the compound containing peroxide bonding is hydrogen peroxide.

19. A method according to claim 1, further comprising introducing an additional gas into the chamber.

20. A method according to claim 19, wherein the additional gas is nitrogen.

21. A method according to claim 19, wherein a flow rate of the additional gas into the chamber is between 50 and 1000 Sccm.

22. A method according to claim 1, wherein the associating substance is premixed with the compound containing peroxide bonding or the silicon-containing compound prior to introduction into the chamber.

23. A method according to claim 1, wherein the associating substance is introduced into the chamber as a separate component.

24. A method according to claim 1, wherein a flow rate of the silicon-containing compound into the chamber is between 20 and 145 Sccm.

25. A method according to claim 1, wherein a flow rate of the compound containing peroxide bonding into the chamber is between 0.2 and 1.0 g/min.

26. A method according to claim 1, wherein a flow rate of the associating substance into the chamber is up to 50 Sccm.

27. A method according to claim 1, wherein a pressure in the chamber is below atmospheric pressure.

28. A method for forming an insulating layer on a surface of a semiconductor substrate by reacting a silicon-containing compound and a compound containing peroxide bonding to deposit a polymer on the surface of the semiconductor substrate, the method further comprising increasing a deposition rate of the polymer by further reacting a substance which associates readily with the compound containing the peroxide bonding.

29. A method according to claim 28, wherein the polymer is a short-chain polymer.

30. A method according to claim 28, wherein the associating substance is an oxidizing agent.

31. A method according to claim 30, wherein the polymer is a short-chain polymer.

32. A method according to claim 30, wherein the oxidizing agent is selected from the group consisting of oxygen, ozone, and tetraethoxysilane.

33. A method according to claim 32, wherein the oxidizing agent is oxygen.

34. A method according to claim 28, wherein the silicon-containing compound is an organisilane of the general formula $C_xH_y$—$Si_nH_a$ or $(C_xH_y)_2Si_nH_a$.

35. A method according to claim 34, wherein the polymer is a short-chain polymer.

36. A method according to claim 28, wherein the silicon-containing compound is of the general formula R—$SiH_3$.

37. A method according to claim 36, wherein R is a methyl, ethyl, phenyl or vinyl group.

38. A method according to claim 37, wherein R is a phenyl or methyl group.

39. A method according to claim 38, wherein R is a methyl group, and a deposition rate of the polymer layer is about 1.1 µm/min.

40. A method according to claim 39, wherein the polymer is a short-chain polymer.

41. A method according to claim 38, wherein R is a Phenyl group and a deposition rate of the polymer layer is about 2700 Å/min.

42. A method according to claim 41, wherein the polymer is a short-chain polymer.

43. A method according to claim 28, wherein the silicon-containing compound is a silane or a higher silane.

44. A method according to claim 43, wherein a deposition rate of the polymer layer is about 1.2 µm/min.

45. A method according to claim 28, wherein the compound containing peroxide bonding is hydrogen peroxide.

46. A method according to claim 45, wherein the polymer is a short-chain polymer.

* * * * *